US006891726B1

(12) United States Patent
Montoya

(10) Patent No.: US 6,891,726 B1
(45) Date of Patent: May 10, 2005

(54) HEAT SINK AND ANTENNA

(75) Inventor: Tom S. Montoya, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/698,635

(22) Filed: Oct. 30, 2003

(51) Int. Cl.[7] .................................................. H05K 7/20

(52) U.S. Cl. ....................... 361/704; 361/717; 361/718; 361/719; 343/872

(58) Field of Search ................................ 361/704, 707, 361/709, 717–719; 257/706, 712; 174/16.3; 165/80.3, 185; 343/700 MS, 872

(56) References Cited

U.S. PATENT DOCUMENTS

| | | | | |
|---|---|---|---|---|
| 5,831,830 A | * 11/1998 | Mahler | ....................... | 361/704 |
| 6,259,933 B1 | * 7/2001 | Bambridge et al. | ......... | 455/557 |
| 6,377,219 B2 | * 4/2002 | Smith | ......................... | 343/702 |
| 6,556,811 B1 | * 4/2003 | Sayers et al. | .............. | 455/90.3 |
| 6,664,928 B2 | * 12/2003 | Ogawa et al. | ....... | 343/700 MS |

* cited by examiner

*Primary Examiner*—Boris Chérvinsky
(74) *Attorney, Agent, or Firm*—Blakely, Sokoloff, Taylor & Zafman LLP

(57) ABSTRACT

Briefly, in accordance with one embodiment of the invention, a heat sink may have an antenna disposed thereon. The antenna may be rotated away from the heat sink in an upper position to adjust the reception of radio-frequency signals when the heat sink is in an extended position. The heat sink may be extended out of the housing in which it is disposed to increase heat dissipation into the ambient environment. The antenna may be rotated into a lower position so that the heat sink and antenna may be retracted into the housing.

19 Claims, 2 Drawing Sheets

HEAT SINK AND ANTENNA

DESCRIPTION OF THE DRAWING FIGURES

Figure 1:
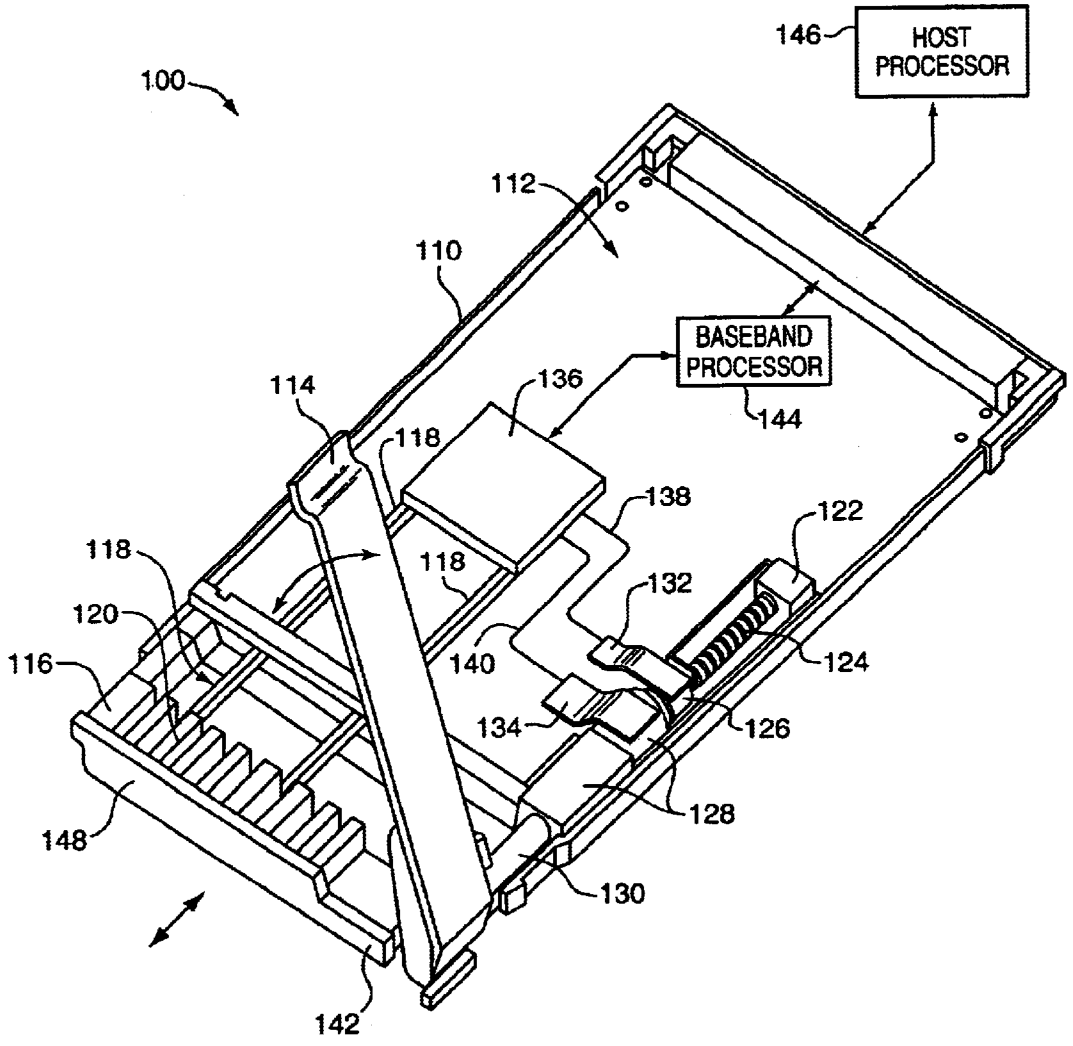
Figure 2:
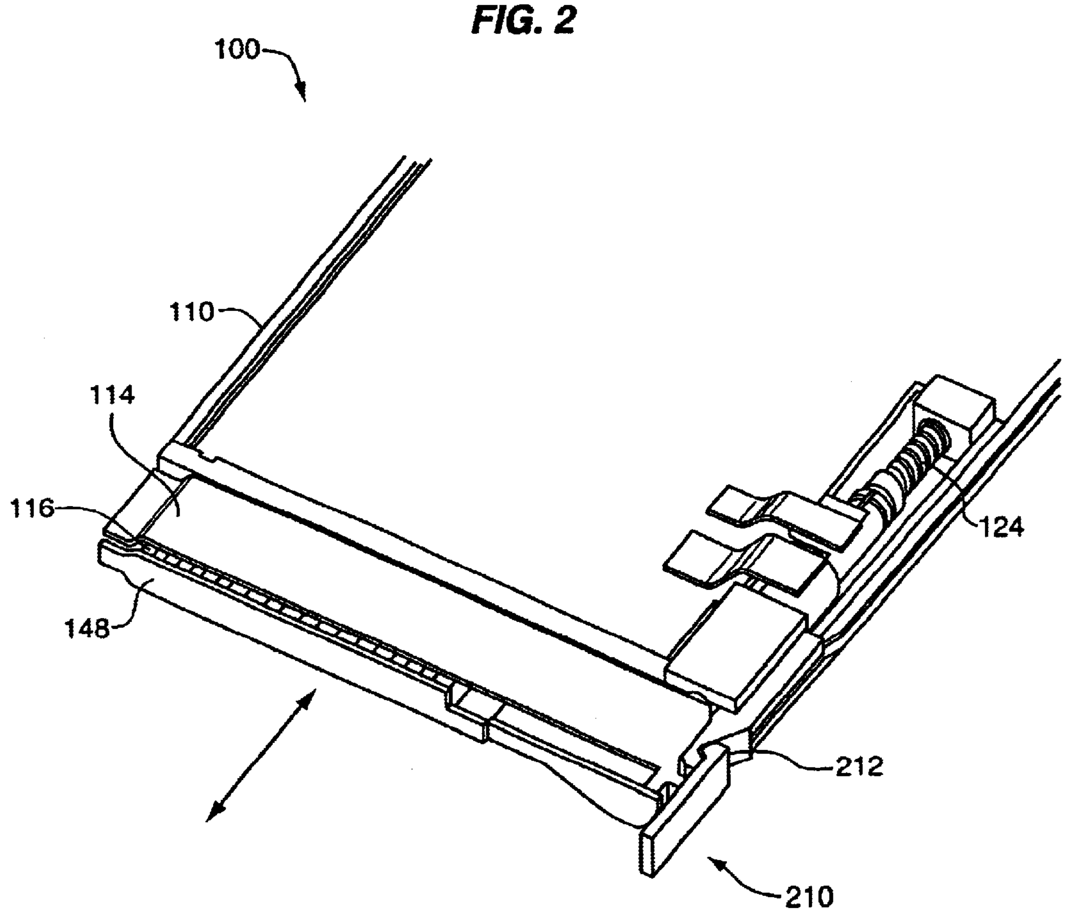

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 is an isometric view of a network interface card having a heat sink and antenna showing the heat sink and antenna in an extended position in accordance with one embodiment of the present invention; and FIG. 2 is another isometric view of a network interface card having a heat sink and antenna showing the heat sink and antenna in a retracted position in accordance with one embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, wireless local area networks (WLAN) devices and wireless wide area network (WWAN) devices including wireless network interface devices and network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), and the like, although the scope of the invention is not limited in this respect.

Types of wireless communication systems intended to be within the scope of the present invention include, although not limited to, Wireless Local Area Network (WLAN), Wireless Wide Area Network (WWAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like, although the scope of the invention is not limited in this respect.

Referring now to FIG. 1, a network interface card having a heat sink and an antenna showing the heat sink and antenna in an extended position in accordance with one embodiment of the present invention will be discussed. Network interface card (NIC) 100 may comprise a housing 110 that contains a printed circuit board 112 where printed circuit board 112 may contain circuitry to allow a host device (not shown) in which network interface card 100 may be utilized to couple the host device to a network. In one particular embodiment of the invention, network interface card 100 is a wireless network interface card to allow the host device to connect to a wireless network such as a wireless local area network (WLAN) or a wireless wide area network (WWAN) although the scope of the invention is not limited in this respect.

In one embodiment, network interface card 100 may be compliant with a PC Card standard or a Personal Computer Memory Card International Association (PCMCIA) specification, and thus may be a self contained module, although the scope of the invention is not limited in this respect. In an alternative embodiment of the invention, network interface card may be integrally disposed within a housing of the host device rather than being a self contained module, although the scope of the invention is not limited in this respect. In yet another alternative embodiment, network interface card may be tangibly embodied within a Peripheral Component Interconnect (PCI) card or the like, such as a MiniPCI card or a PCI extended (PCI-X) card, although the scope of the invention is not limited in this respect. In a still further embodiment of the invention, rather than being implemented within a host device, network interface card module 100 may itself be tangibly embodied as the host device, for example where host processor 146 is disposed internally within housing 110 and optionally disposed on printed circuit board 112, although the scope of the invention is not limited in this respect.

Network interface card 100 may include a heat sink 148 to which an antenna 114 may be attached. Heat sink 148 may include a heat dissipation block 116 that may be included beat dissipation ribs for providing heat dissipation surface area. One or more heat conductors 118 may couple heat dissipation block 116 of heat sink 140 to at least one integrated circuit 136 or more integrated circuits of network interface card 100 where integrated circuit 136 may be disposed on printed circuit board 112, although the scope of the invention is not limited in this respect. In one embodiment, where network interface card 100 is a wireless network interface card, integrated circuit 136 may include a radio-frequency circuit, an intermediate-frequency (IF) circuit, a base band processor such as shown by baseband processor block 144, and associated circuits such as oscillators and analog-to-digital converters (ADCs) and digital-to-analog converters (DACs), filters, memory, and so on, in any combination, although the scope of the invention is not limited in this respect. In one embodiment, a radio circuit may be disposed on one integrated circuit and baseband processor 144 may be disposed on another integrated circuit where one or the other or both integrated circuits may couple to heat dissipation block 116 of heat sink 148 via heat conductor 118. In an alternative embodiment a the radio circuit and baseband processor 144 may be disposed together on a single integrated circuit where the integrated circuit 136 may couple to heat dissipation block 116 of heat sink 148 via heat conductor 118 although the scope of the invention is not limited in this respect.

In one embodiment of the invention, any one or more of the elements of heat sink 148 including heat dissipation block 116, heat sink fins 120, and heat conductor 118 may be constructed from VAN-THERM, a heat conducting elastomer available from Vanguard Products Corporation, although the scope of the invention is not limited in this respect. In another embodiment of the invention, any one or more of the elements of heat sink 148 including heat dissipation block 116, heat sink fins 120, and heat conductor 118 may be constructed from a thermally conductive metal such as zinc, although the scope of the invention is not limited in this respect. Embodiments of the invention also may include utilizing zinc and VAN-THERM in combination.

In one embodiment of the invention, heat sink 148 including heat dissipation block 116 and antenna 114 may be retractable from and into housing 110 of network interface card 100. A spring block 122 may provide a fixed structure against which a spring 124 may be compressed to cause heat sink 148 to extend from the interior of the housing 110 of network interface card 100. A conductor cap 126 may be disposed concentrically with a shaft 130 to which antenna 114 may be mounted. Antenna 114 may be affixed to shaft 130 so that antenna 114 may be free to rotate about a central axis of shaft 130 so that antenna 114 may be disposed in a lower position against heat dissipation block 116 in a first position, for example so that heat sink 148 may be retracted within housing 110 of network interface card for storage. Antenna 114 may also be rotated away from heat dissipation block 116 when heat sink 148 is in an extended position, for example to alter or maximize the reception of radio-frequency (RF) signals via antenna 114 as shown in FIG. 1.

Conductor cap 126 may maintain contact with spring contact 132 which may be biased against conductor cap 126 to maintain physical and electrical contact therewith. Likewise, a connector body 128 may maintain contact with spring contact 134 which may be biased against connector body 128 to maintain physical and electrical contact therewith. Connector body 126 may be at a ground potential and connector cap may at the potential generated by an RF signal received via antenna 114. Electrical traces 138 and 140 may electrically couple antenna 114 with integrated circuit 136 via conductor cap 126 and connector body 128, and via spring contacts 132 and 134.

In one embodiment of the invention, heat sink 148 may be in an extended position during operation of network interface card 100 where operation of integrated circuit 136 may generate heat that is conducted to heat dissipation block 116 via heat conductors 118 and where heat may be transferred to the ambient environment via heat fins 120. During such operation, the temperature of heat dissipation block 116 may rise. An end cap 142 may be disposed on heat sink 148 at an end of heat dissipation block 116. End cap 142 may be an insulating material so that a user-may retract heat sink 148 and antenna 114 into housing 110 of network interface card 100 without directly touching heat dissipation block 116 or heat fins 120. In one embodiment of the invention, end cap 142 may be an over molded plastic material such as ULTEM, a heat resistant amorphous thermoplastic polyetherimide available from the General Electric Company, although the scope of the invention is not limited in this respect. Optionally, end cap may be colored to match housing 100 of network interface card 100 or to match a housing of the host device in which network interface card may be disposed, although the scope of the invention is not limited in this respect.

Referring now to FIG. 2, a network interface card having a heat sink and antenna in a retracted position in accordance with one embodiment of the invention will be discussed. As shown in FIG. 2, antenna 114 may be positioned in a lowered position against heat dissipation block 116 of heat sink 148 so that heat sink 148 including antenna 114 may be retracted into housing 110 of network interface card 100. When a user pushes heat sink 148 and antenna 114 into housing of network interface card 100, spring 124 may compress to provide a force opposing the force causing heat sink 148 and antenna 114 to be retracted into housing 100. A latch 210 on heat sink 148 may catch with a latch 212 on housing 100 of network interface card to secure heat sink 148 and antenna 114 into a retracted position as shown in FIG. 2. When latches 210 and 212 couple, spring 124 remains in a compressed state so that when a user releases latch 210 from latch 212 by actuating latch 210, the force generated by the compression of spring 124 will cause heat sink 148 and antenna 114 to be extended out of housing 110 from a retracted position to an extended position as shown in FIG. 1. When in an extended position, antenna 114 may be rotated into an upper position for adjustable reception of RF signals, and heat sink 148 may dissipate heat into the ambient environment via increased exposure to the air and increased airflow across heat sink fins 120, although the scope of the invention is not limited in this respect. It should be noted that network interface card 100 may operate with heat sink 148 and antenna 114 disposed in either a retracted position or in an extended position, and the scope of the invention is not limited in this respect.

Although the invention has been described with a certain degree of particularity, it should be recognized that elements thereof may be altered by persons skilled in the art without departing from the spirit and scope of the invention. It is believed that the heat sink and antenna of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:

a heat sink; and an antenna connected to said heat sink wherein said antenna may be moved relative to said heat sink.

2. An apparatus as claimed in claim 1, wherein said antenna may be disposed against said heat sink in a first position, and away from said heat sink in a second position.

3. An apparatus as claimed in claim 1, wherein said heat sink and said antenna may be disposed within a housing when said heat sink is in a first position, and said heat sink and said antenna may extend at least partially from the housing with said heat sink is in a second position.

4. An apparatus as claimed in claim 1, said antenna to electrically couple to a circuit disposed on an integrated circuit, and said heat sink to dissipate heat from said integrated circuit.

5. An apparatus as claimed in claim 1, further comprising an end cap, wherein a user may push on said end cap to place said heat sink into at least a retracted position within a housing.

6. An apparatus, comprising:

a housing;

a heat sink to dissipate heat generated within said housing; and an antenna;

wherein said heat sink and said antenna may be at least partially retracted within said housing in a first position, and wherein said heat sink and said antenna may be at last partially extended from said housing in a second position.

7. An apparatus as claimed in claim 6, wherein said heat sink is thermally coupled to a first integrated circuit, and said antenna is electrically coupled to a second integrated circuit.

8. An apparatus as claimed in claim 6, said heat sink to thermally couple to an integrated circuit, and said antenna to electrically couple to the integrated circuit.

9. An apparatus as claimed in claim 6, said heat sink to thermally couple to a processor disposed within the housing, and said antenna to electrically couple to a radio-frequency circuit within said housing.

10. An apparatus as claimed in claim 6, wherein said antenna may be moved relative to said heat sink when said heat sink is disposed in an extended position.

11. An apparatus as claimed in claim 6, further comprising a spring to force said heat sink into an extended position at least partially extending from said housing.

12. An apparatus as claimed in claim 6, further comprising a heat conductor to conduct heat from an intergrated circuit within said housing to said heat sink.

13. A network interface card, comprising:

a housing;

a baseband processor;

a radio-frequency transceiver; and a heat sink and antenna;

wherein said heat sink is thermally coupled to at least one of said radio-frequency transceiver and said baseband processor, said antenna to couple to said radio-frequency transceiver, and said heat sink and said antenna to be at least partially retracted within said housing in a first position and at least partially extended from said housing in a second position.

14. A network interface card as claimed in claim 13, wherein said antenna is movable with respect to said heat sink.

15. A network interface card as claimed in claim 13, wherein said baseband processor and said radio-frequency transceiver are disposed on a single integrated circuit.

16. A network interface card as claimed in claim 13, at least one function of said baseband processor to be executed by a host processor disposed in a host computing platform.

17. A computing platform, comprising:

a housing;

an input device disposed on said housing;

an integrated circuit disposed within said housing;

a heat sink to dissipate heat generated by said integrated circuit; and an antenna;

wherein said heat sink and said antenna may be at least partially retracted within said housing in a first position, and wherein said heat sink and said antenna may be at last partially extended from said housing in a second position.

18. A computing platform as claimed in claim 17, wherein said input device is connectable to at least one of a touch pad, a keyboard, and a touch screen.

19. A computing platform as claimed in claim 17, further comprising an end cap disposed on an end of said heat sink.

* * * * *